(12) United States Patent
Gai

(10) Patent No.: US 7,145,222 B2
(45) Date of Patent: Dec. 5, 2006

(54) LEADLESS SEMICONDUCTOR PACKAGE

(75) Inventor: Yung Feng Gai, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 93 days.

(21) Appl. No.: 10/901,090

(22) Filed: Jul. 29, 2004

(65) Prior Publication Data
US 2005/0046008 A1    Mar. 3, 2005

(51) Int. Cl.
*H01L 23/495* (2006.01)
(52) U.S. Cl. ............... 257/667; 257/676; 257/E23.001
(58) Field of Classification Search .............. 257/666, 257/676, 667, 735, 785
See application file for complete search history.

(56) References Cited

U.S. PATENT DOCUMENTS 6,303,985 B1 * 10/2001 Larson et al. ............... 257/676
6,585,905 B1 * 7/2003 Fan et al. ..................... 216/14
6,661,083 B1 * 12/2003 Lee et al. .................... 257/676
2004/0217450 A1 * 11/2004 Li et al. ...................... 257/666

* cited by examiner

*Primary Examiner*—David Nelms
*Assistant Examiner*—Quoc Hoang
(74) *Attorney, Agent, or Firm*—Bacon & Thomas, PLLC

(57) ABSTRACT

A leadless semiconductor package mainly comprises a leadless lead-frame, a chip, a silver paste and a plurality of electrically conductive wires. The leadless lead-frame includes a chip paddle and a plurality of leads surrounding the chip paddle wherein the chip paddle has a cavity serving as a chip disposal area and a grounding area encompassing the cavity. The chip is disposed in the cavity so that the back surface of the chip faces the chip paddle and attached onto the chip paddle via the silver paste. Moreover, the chip is electrically connected to the leads. The grounding area is at the periphery of the chip paddle, and furthermore it is protruded from the chip disposal area so as to prevent the silver paste from overflowing on the grounding area. Thus, the electrically conductive wires will attach onto the grounding area well and enhance the electrical performance of the leadless semiconductor package.

5 Claims, 4 Drawing Sheets

LEADLESS SEMICONDUCTOR PACKAGE

BACKGROUND OF THE INVENTION

1. Field of Invention

This invention relates to a leadless semiconductor package. More particularly, the present invention is related to a leadless semiconductor package with high reliability of the attachment of the chip to the leadless lead-frame.

2. Related Art

Integrated circuits (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits. Nowadays, ball grid array package (BGA) and chip scale package (CSP) are wildly applied to chip package with high I/Os and assembly package for thermal enhance integrated circuits.

However, assembly package with lead frame possesses great marketing for that it can provide low-cost solutions for current semiconductor package. Due to lead frame with long inner leads and outer leads, such conventional lead-frame assembly package can not applied to chip scale package and low profile package. Thus leadless assembly package, such as Quad-Flat-Non-lead Package which is initially developed by Matsushita, is wildly provided in the semiconductor package industry to reduce the size of the assembly package in the recent years. Referring to FIG. 1, a conventional leadless assembly package is disclosed. The leadless semiconductor package 100 mainly comprises a leadless lead-frame 110, such as a copper lead-frame, a chip 120, an adhesive 130, a plurality of conductive wires 140 and an encapsulation 150. Therein, the leadless lead-frame 110 has a chip paddle 112 and a plurality of leads 114 surrounding the chip paddle 112; and the chip paddle 112 comprises a chip disposal area 112a and a grounding area 112b; and the chip 120 is disposed above the chip disposal area 112a through an adhesive 130, such as silver paste, connecting the back surface 122 of the chip 120 and the chip disposal area 112a. Moreover, the chip 120 further has an active surface 124 and a plurality of bonding pads 126 formed on the active surface 124; and the chip 120 is electrically connected to the top 114a of the lead 114 and the grounding area 112b of the chip paddle 112 through the conductive wires 140, such as gold wires. And the encapsulation 150, such as molding compound, encapsulates the leadless lead-frame 110, the chip 120 and the conductive wires 130 and exposes the bottom 112c of the chip pad 112 and the bottom 114b of the leads 114 so as to form a plurality of electrical terminals to connect to external electronic devices through surface mount technology (SMT).

As mentioned above, the chip paddle 112 of said leadless semiconductor package 100 exposes the bottom 112c and 114b of the leadless semiconductor package 100 so as to further enhance the thermal performance of said leadless semiconductor package. Furthermore, due to the short leads, the impedance will be lower. Accordingly, the leadless semiconductor package is especially adapted to the assembly package with high-frequency devices, which are performed at the frequency from 10 GHz to 100 GHz, enclosed therein. In such a manner, such leadless semiconductor package has low cost and competitive price. Therefore the leadless semiconductor package is adapted to cell phone, personal digital application (PDA), digital camera and information application (IA).

As can be seen, an adhesive 130 is interposed between the chip disposal area 112a of the chip paddle 112 and the back surface 122 of the chip 120 to have the chip 120 securely attached to the chip paddle 112. However, when the adhesive 130 is an epoxy resin or a silver paste and the size of the chip 120 is slightly smaller than the size of the chip paddle 112, the adhesive 130 is easily to flash over and flow over the grounding area 112b. Specifically, when the distance between the periphery 128 of the chip 120 and the periphery of the chip paddle 112, namely the width D of the grounding area 112b, is not greater than six (6) mils, exceeding adhesive will more easily flash over and flow over the grounding area 112b so that the conductive wires 130 will not be well bonded to the grounding area 112b and the reliability of said package will be lowered.

Consequently, providing another leadless semiconductor package to solve the mentioned-above disadvantages is the most important task in this invention.

SUMMARY OF THE INVENTION

In view of the above-mentioned problems, this invention is to provide a leadless semiconductor package with high reliability of the attachment of the chip to the leadless lead-frame.

To achieve the above-mentioned, a leadless semiconductor package is provided, wherein the leadless semiconductor package mainly comprises a chip and a lead frame. The lead frame has a chip paddle and a plurality of leads wherein the chip paddle has a cavity and a grounding area encompassing the cavity, and the chip has a plurality of bonding pads formed on the active surface and is disposed in the cavity. In addition, a plurality of electrically conductive wires are provided to electrically connect the chip not only to the chip paddle for grounding but also the leads for transmitting electrical signals to external electronic devices. To be noted, an adhesive is provided in the cavity for attaching the chip to the chip paddle so as to prevent the adhesive from being flashed over and flowed over the grounding area.

Besides, the cavity further has at least a concavity formed therein Accordingly, when the chip is placed on the chip paddle through the adhesive, the contact area of the adhesive with the chip paddle will be increased to enhance the attachment of the chip to the chip paddle. As mentioned above, the grounding area is protruded from the chip paddle and above the bottom of the cavity so as to prevent the adhesive from flashing over the grounding area and cause the adhesive well distributed in the cavity. In such a manner, the electrically conductive wires will be well bonded to the grounding area.

Besides, the chip is placed in the cavity so that the total thickness of the package will become smaller. Accordingly, there is a thinner leadless semiconductor package provided.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The leadless semiconductor package according to the preferred embodiments of this invention will be described herein below with reference to the accompanying drawings, wherein the same reference numbers refer to the same elements.

Figure 1:
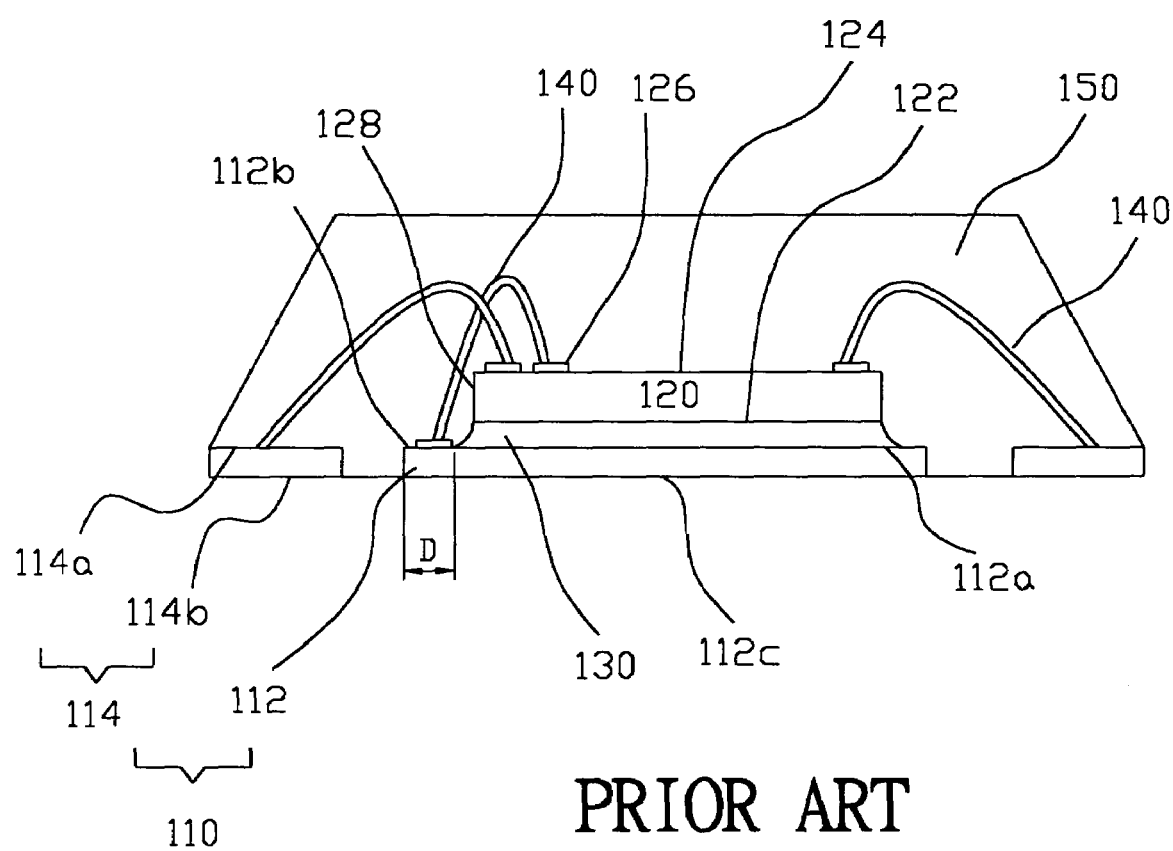
FIG. 1 is a cross-sectional view of the conventional leadless semiconductor package.
Figure 2:
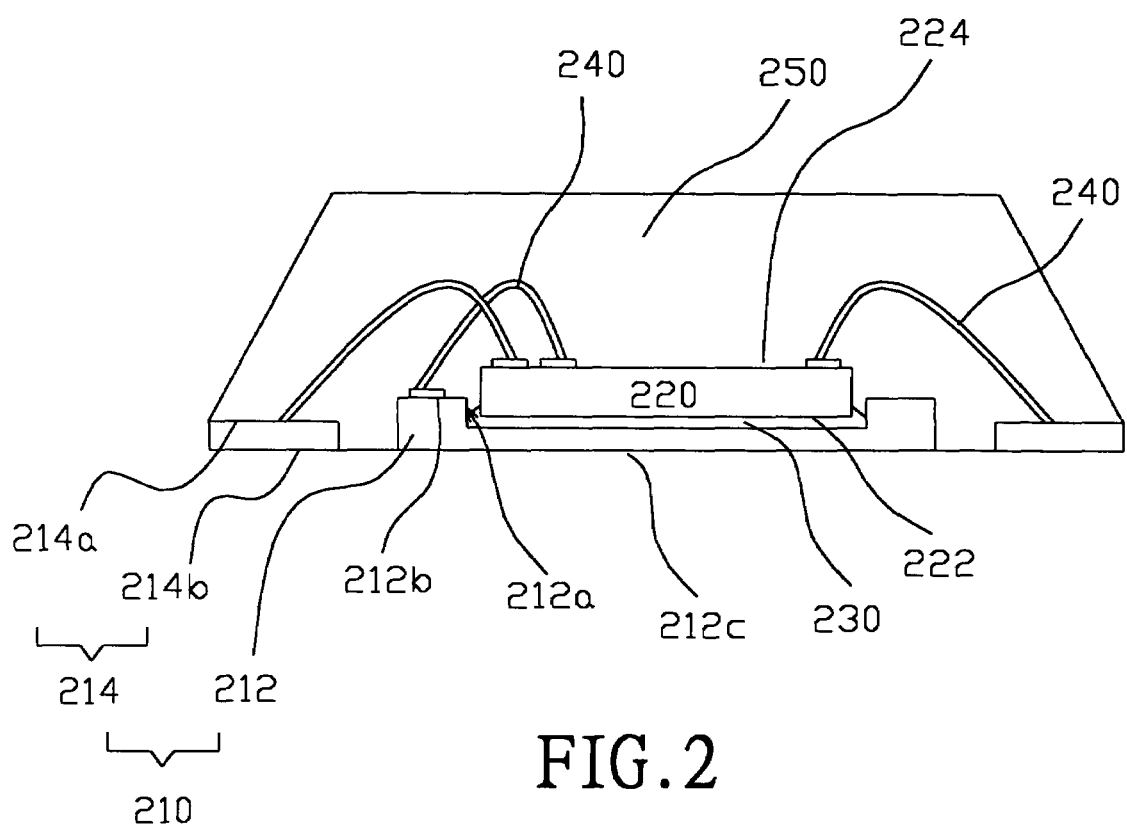
FIG. 2 is a cross-sectional view of a leadless semiconductor package according to the first embodiment of the present invention.

In accordance with a first preferred embodiment as shown in FIG. 2, there is provided a leadless semiconductor package. The leadless semiconductor package mainly comprises a lead frame 210, a chip 220, an adhesive 230 and a plurality of electrically conductive wires 240. Therein, the lead frame 210, such as a leadless lead-frame, has a chip paddle 212 and a plurality of leads 214 surrounding the chip paddle 212. Moreover, the chip paddle 212 has a cavity 212a formed therein and a grounding area 212b surrounding the cavity 212a; and the chip 220 has a back surface 222 and an active surface 224, and the chip 220 is placed in the cavity 212a of the chip paddle 212 through the adhesive 230. In addition, the electrically conductive wires 240 are electrically bonded to the grounding area 212b and the leads 214 respectively. Furthermore, an encapsulation 250, such as molding compound, is provided to encapsulate the chip 220, the wires 240, the cavity 212a and the grounding area 212b of the chip paddle 212 and the top 214a of the lead 214 and expose the bottom 214b of each lead 214 and the bottom 212c of the chip paddle 212 to form electrical terminals for connecting to external electronic devices. To be noted, in order to enhance the attachment of the wires 240 to the grounding area 212b and the leads 214, there is generally a metal layer, such as a silver metal layer, formed thereon.

Figure 3:
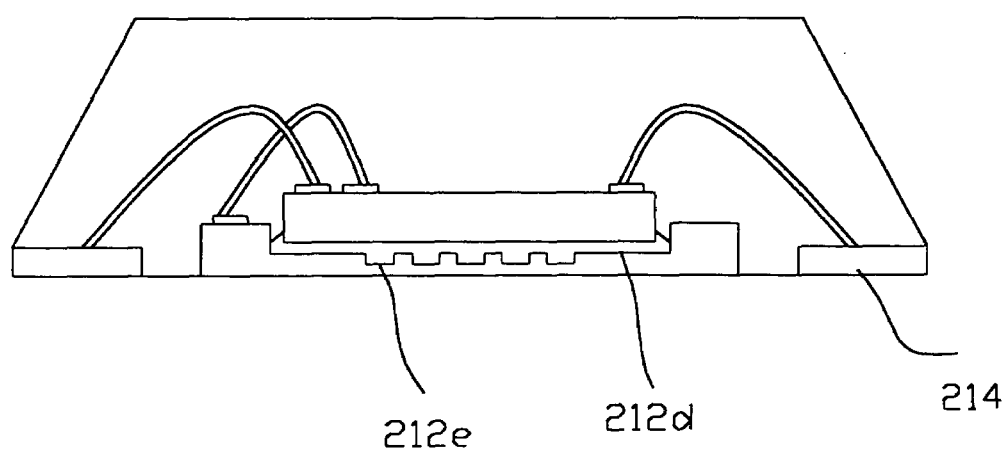
FIG. 3 is a cross-sectional view of a leadless semiconductor package according to the second and third embodiments of the present invention.
Figure 4:
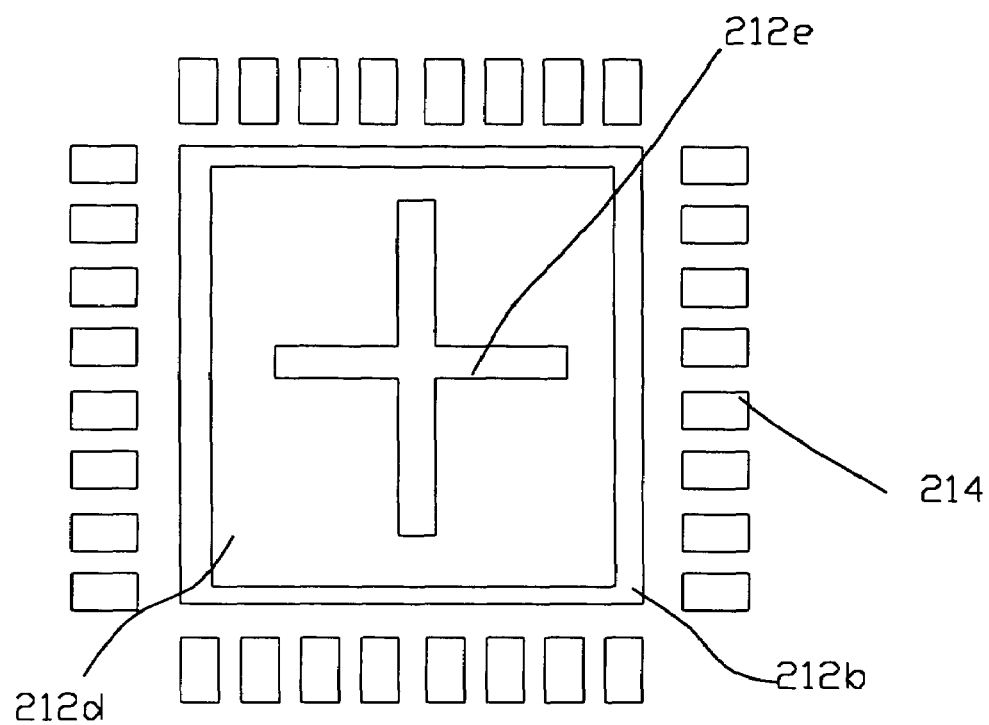
FIG. 4 is a top view of the cavity formed in the chip paddle of the lead frame according to the second embodiment of FIG. 3.
Figure 5:
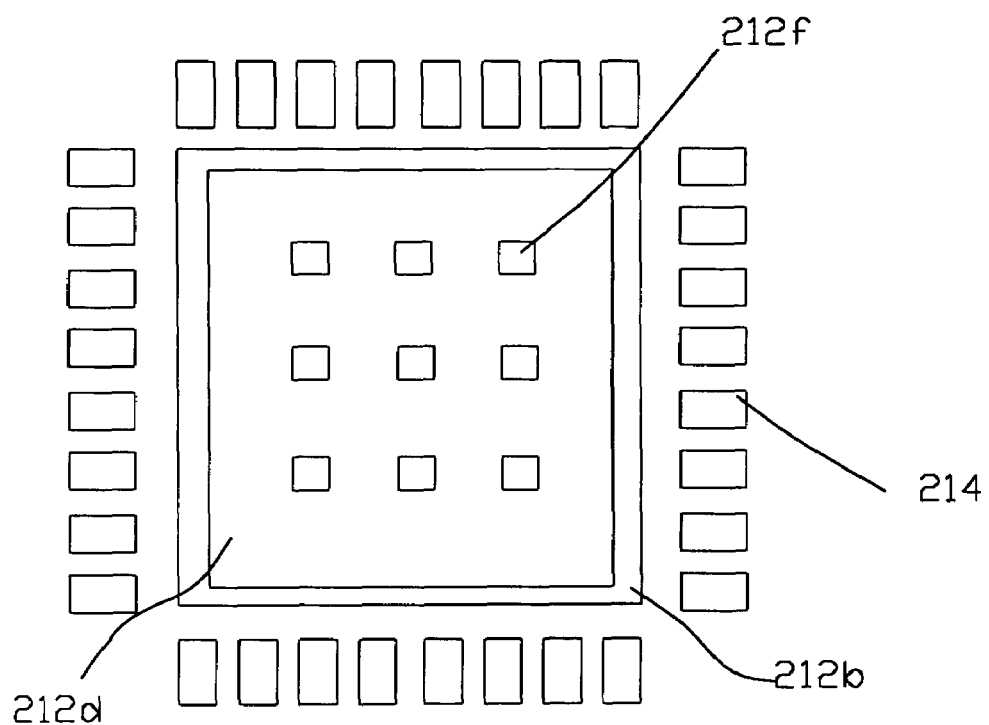
FIG. 5 is a top view of the concavity formed in the chip paddle of the lead frame according to the third embodiment of FIG. 3.
Figure 6:
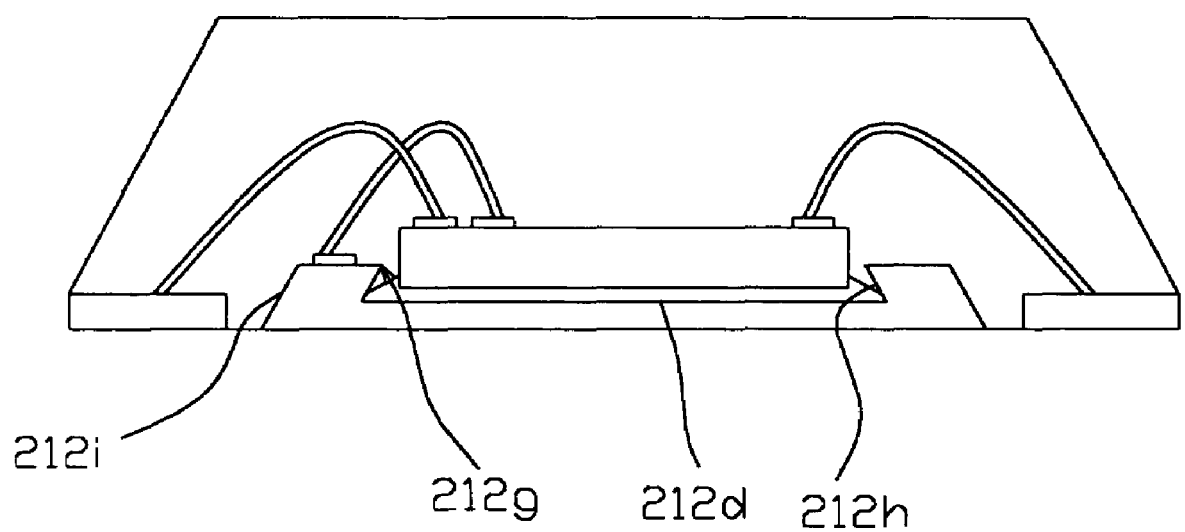
FIG. 6 is a cross-sectional view of a leadless semiconductor package according to the fourth and third embodiments of the present invention.

Furthermore, as shown in FIG. 3, FIG. 4 and FIG. 5, in order to have the cavity 212a accommodate more and more adhesive to prevent exceeding adhesive from flashing over and flowing over the grounding area 212b, a slot 212e is formed at the bottom 212d of the cavity 212a as shown in FIG. 3 and FIG. 4 illustrating the second embodiment, or at least a concavity 212f, as shown in FIG. 3 and FIG. 5 illustrating the third embodiment, is formed at the bottom 212d of the cavity 212a. In such a manner, not only more and more adhesive could be accommodated in the cavity 212a but also the contact area of the adhesive with the cavity 212a is increased to enhance the attachment of the chip 220 to the chip paddle 212. To be noted, the slot 212e and concavity 212f can be formed by the method of punching and half-etching. Moreover, as mentioned above, when there are a plurality of concavities are formed, the concavities can be arranged in an area array; and when there are a plurality of slots are formed, the slots can be shaped into a cross-like slot. Besides, as shown in FIG. 6 illustrating the forth embodiment, when the cavity 212a is formed, the etching mask and the etching time can be well chosen and controlled to form a cavity with an opening 212g smaller than the bottom 212d of the cavity 212a as shown in FIG. 6. Namely, the side wall 212h of the cavity 212a can be designed as a skew or slant side wall to form an angle between the side wall 212h and the bottom 212d of the cavity 212 smaller than 90 degree to enhance the attachment of the encapsulation 250 to the lead frame 210. In addition, the outer wall 212i of the chip paddle 210 can be skew or slant to further enhance the attachment of the encapsulation 250 to the lead frame 210.

As mentioned above, usually the depth of the cavity 212a is about half of the thickness of the chip paddle 212. Thus, when the chip 220 is placed in the cavity 212a through the adhesive 230 disposed in the cavity 212a, the adhesive 230 could be well controlled in the cavity 212a due to the grounding area 212b be protruded from the cavity 212a and above the bottom 212d of the cavity 212a. In such a manner, the wires 240 will be well bonded to the grounding area 212b. In addition, because the chip 220 is placed in the cavity 212a, the top of the wires connecting the leads 214 or the grounding area 212b will be lowered to shorten the length of the wires 240 and lower the impedance of the wires 240. Accordingly, the electrical performance will be enhanced. Besides, the chip 220 is placed in the cavity 212b so that the total thickness of the package will become smaller. Accordingly, there is a thinner leadless semiconductor package provided.

Although the invention has been described in considerable detail with reference to certain preferred embodiments, it will be appreciated and understood that various changes and modifications may be made without departing from the spirit and scope of the invention as defined in the appended claims.

What is claimed is:

1. A leadless semiconductor package, comprising:
    a lead frame, said lead frame having a chip paddle, a plurality of leads surrounding said chip paddle wherein the chip paddle has a cavity and a grounding area surrounding the cavity, and the cavity has an opening and a bottom and the bottom is larger than the opening in size;
    an adhesive disposed in the cavity;
    a chip, said chip having an active surface and a back surface opposed to the active surface, and said back surface disposed in the cavity and attached to the lead frame through the adhesive;
    a plurality of first electrically conductive wires electrically connecting the leads and the chip; and
    a plurality of second electrically conductive wires electrically connecting the grounding area and the chip.

2. The leadless semiconductor package of claim 1, wherein said cavity further has a slot formed therein.

3. The leadless semiconductor package of claim 1, wherein said cavity further has a concavity formed therein.

4. The leadless semiconductor package of claim 1, wherein the depth of the cavity is at least greater than half of the thickness of the chip paddle.

5. The leadless semiconductor package of claim 1, wherein the depth of the cavity is equal to half of the thickness of the chip paddle.

* * * * *